US011710685B2

(12) United States Patent
Yoshii et al.

(10) Patent No.: US 11,710,685 B2
(45) Date of Patent: Jul. 25, 2023

(54) SEMICONDUCTOR MODULE AND POWER CONVERSION DEVICE

(71) Applicant: Mitsubishi Electric Corporation, Tokyo (JP)

(72) Inventors: Dai Yoshii, Tokyo (JP); Hantaro Ozawa, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 338 days.

(21) Appl. No.: 17/080,963

(22) Filed: Oct. 27, 2020

(65) Prior Publication Data
US 2021/0175158 A1    Jun. 10, 2021

(30) Foreign Application Priority Data
Dec. 5, 2019   (JP) ................ 2019-220062

(51) Int. Cl.
H01L 23/495   (2006.01)
H01L 23/31    (2006.01)
H02P 27/08    (2006.01)

(52) U.S. Cl.
CPC .... H01L 23/49575 (2013.01); H01L 23/3107 (2013.01); H01L 23/4952 (2013.01);
(Continued)

(58) Field of Classification Search
CPC ........... H01L 23/49575; H01L 23/3107; H01L 23/49503; H01L 23/4952; H01L 23/49562; H01L 23/49568
See application file for complete search history.

(56) References Cited

U.S. PATENT DOCUMENTS 5,492,842 A  *  2/1996  Eytcheson ............. H01L 25/18
                                                      438/15
2007/0200537 A1   8/2007  Akiyama et al.
(Continued)

FOREIGN PATENT DOCUMENTS

JP   2007-227763 A   9/2007
JP   2012-074720 A   4/2012
(Continued)

OTHER PUBLICATIONS

Communication dated Feb. 24, 2021 from the Japanese Patent Office in Application No. 2019-220062

Primary Examiner — Marc Anthony Armand
(74) Attorney, Agent, or Firm — Sughrue Mion, PLLC; Richard C. Turner

(57) ABSTRACT

The present application provides a semiconductor module and a power conversion device wherein wiring inductance is reduced. The semiconductor module is characterized by including a semiconductor element, a first terminal on which the semiconductor element is mounted, a second terminal disposed in a periphery of the semiconductor element and having a multiple of wiring portions, and a multiple of connection lines extending in multiple directions from an upper face of the semiconductor element and connected to each of the multiple of wiring portions of the second terminal, wherein a free region is provided among the multiple of wiring portions, and the multiple of connection lines and the multiple of wiring portions forming current paths with each of the multiple of connection lines are of the same potential.

21 Claims, 9 Drawing Sheets

(52) U.S. Cl.
CPC .. *H01L 23/49503* (2013.01); *H01L 23/49562* (2013.01); *H01L 23/49568* (2013.01); *H02P 27/08* (2013.01)

(56) References Cited

U.S. PATENT DOCUMENTS

| | | | |
|---|---|---|---|
| 2010/0127371 A1* | 5/2010 | Tschirbs | H05K 1/142 |
| | | | 257/E23.083 |
| 2015/0023081 A1 | 1/2015 | Obiraki et al. | |
| 2016/0172995 A1 | 6/2016 | Obiraki et al. | |

FOREIGN PATENT DOCUMENTS

| | | |
|---|---|---|
| JP | 2013-183540 A | 9/2013 |
| JP | 2014-225706 A | 12/2014 |

\* cited by examiner

SEMICONDUCTOR MODULE AND POWER CONVERSION DEVICE

BACKGROUND OF THE INVENTION

1. Field of the Invention

The present application relates to a semiconductor module and a power conversion device.

2. Description of the Related Art

A semiconductor module used in a power conversion device is configured of a lead frame in which a wiring pattern is formed and a semiconductor element mounted on the lead frame. The semiconductor element carries out a switching operation when power is converted. The semiconductor module is such that a surge voltage $\Delta V = L \cdot di/dt$ is generated in accordance with a time rate of change $di/dt$ of current when the semiconductor element switches and an inductance L of the wiring pattern, and the surge voltage is applied to the semiconductor element. The greater the wiring pattern inductance L in the semiconductor module, the greater the surge voltage, which causes damage to the semiconductor element, because of which there is an existing demand for a reduction in wiring pattern inductance.

For example, a semiconductor module disclosed in Patent Literature 1 or Patent Literature 2 is such that a terminal array or a semiconductor element disposition is revised in order to reduce wiring inductance.

Patent Literature 1: JP-A-2014-225706
Patent Literature 2: JP-A-2013-183540

However, the existing semiconductor modules disclosed in Patent Literature 1 and Patent Literature 2 are such that the reduction of the wiring pattern inductance is not sufficiently carried out.

SUMMARY OF THE INVENTION

The present application discloses technology for resolving the heretofore described kind of problem, and has an object of providing a semiconductor module and a power conversion device wherein wiring inductance is further reduced.

A semiconductor module disclosed in the present application is characterized by including a semiconductor element, a first terminal on which the semiconductor element is mounted, a second terminal disposed in a periphery of the semiconductor element and having a multiple of wiring portions, and a multiple of connection lines extending in multiple directions from an upper face of the semiconductor element and connected to each of the multiple of wiring portions of the second terminal, wherein a free region is provided among the multiple of wiring portions, and the multiple of connection lines and the multiple of wiring portions forming current paths with each of the multiple of connection lines are of the same potential.

Also, a power conversion device disclosed in the present application is characterized by including the semiconductor module disclosed in the present application, a main conversion circuit that converts and outputs an input power, and a control circuit that outputs a control signal that controls the main conversion circuit to the main conversion circuit.

According to the semiconductor module disclosed in the present application, a semiconductor module and a power conversion device wherein wiring inductance is reduced are obtained.

The foregoing and other objects, features, aspects, and advantages of the present application will become more apparent from the following detailed description of the present application when taken in conjunction with the accompanying drawings.

DETAILED DESCRIPTION OF THE PREFERRED EMBODIMENTS

First Embodiment

Figure 1:
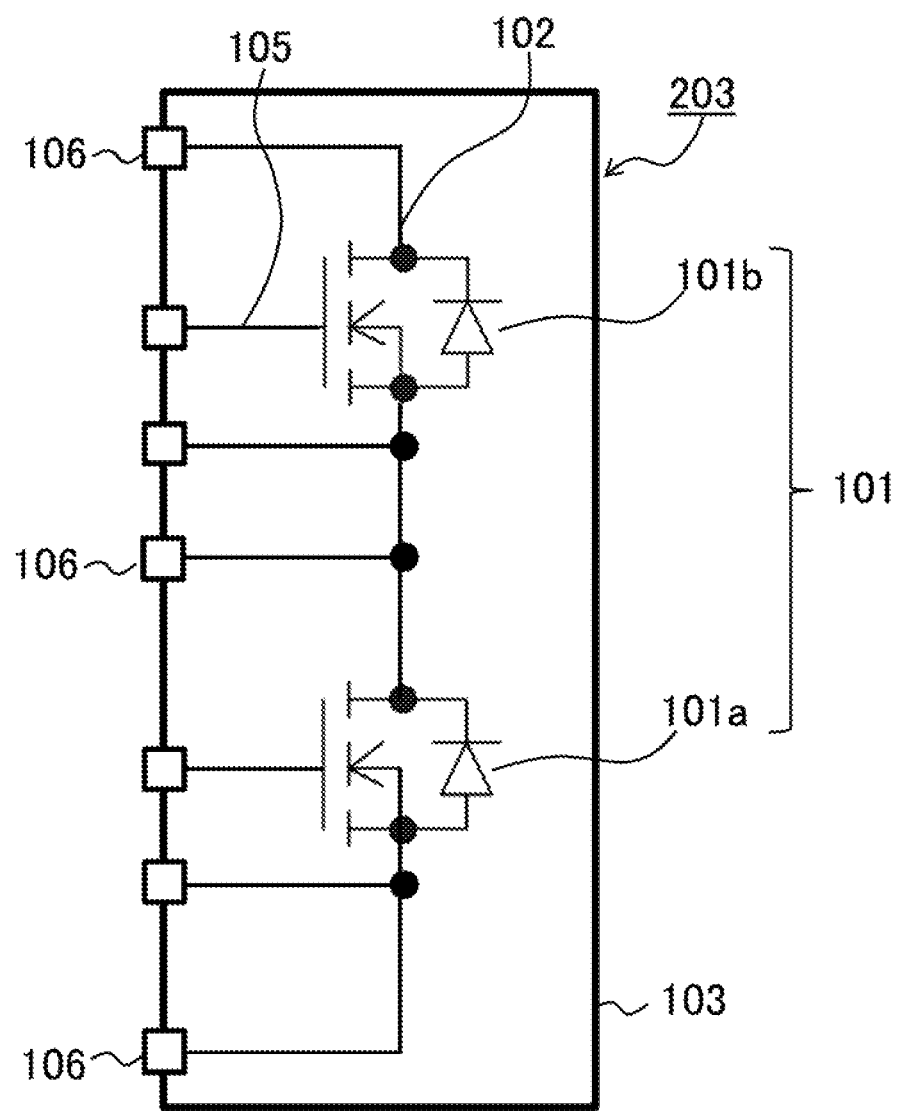
FIG. 1 is a circuit diagram showing a semiconductor module according to a first embodiment.

Hereafter, a first embodiment will be described, based on the drawings. Identical reference signs in the drawings indicate identical or corresponding portions.

Also, a semiconductor module disclosed in the present application is utilized as a power conversion device of a power circuit combined with a motor of an inverter or the like, or of a power circuit combined with a transformer of a step-down converter or the like. Further still, the semiconductor module disclosed in the present application is applied to a power electronic circuit used with the intention of configuring product functions at a small size, compactly, and with high efficiency, and incorporates a semiconductor switching element. Also, although the present application is described with a precondition that a mainstream N-channel semiconductor element is used in the power conversion device, a P-channel semiconductor element may be used. When a P-channel semiconductor element is used, polarity is reversed.

Also, although an example wherein a metal-oxide-semiconductor field-effect transistor (hereafter called a MOSFET) is used as a semiconductor element disclosed in the present application is described, a semiconductor element means a semiconductor switching element including an insulated gate bipolar transistor (IGBT), a reverse-conducting insulated gate bipolar transistor (RC-IGBT), or the like.

Figure 2:
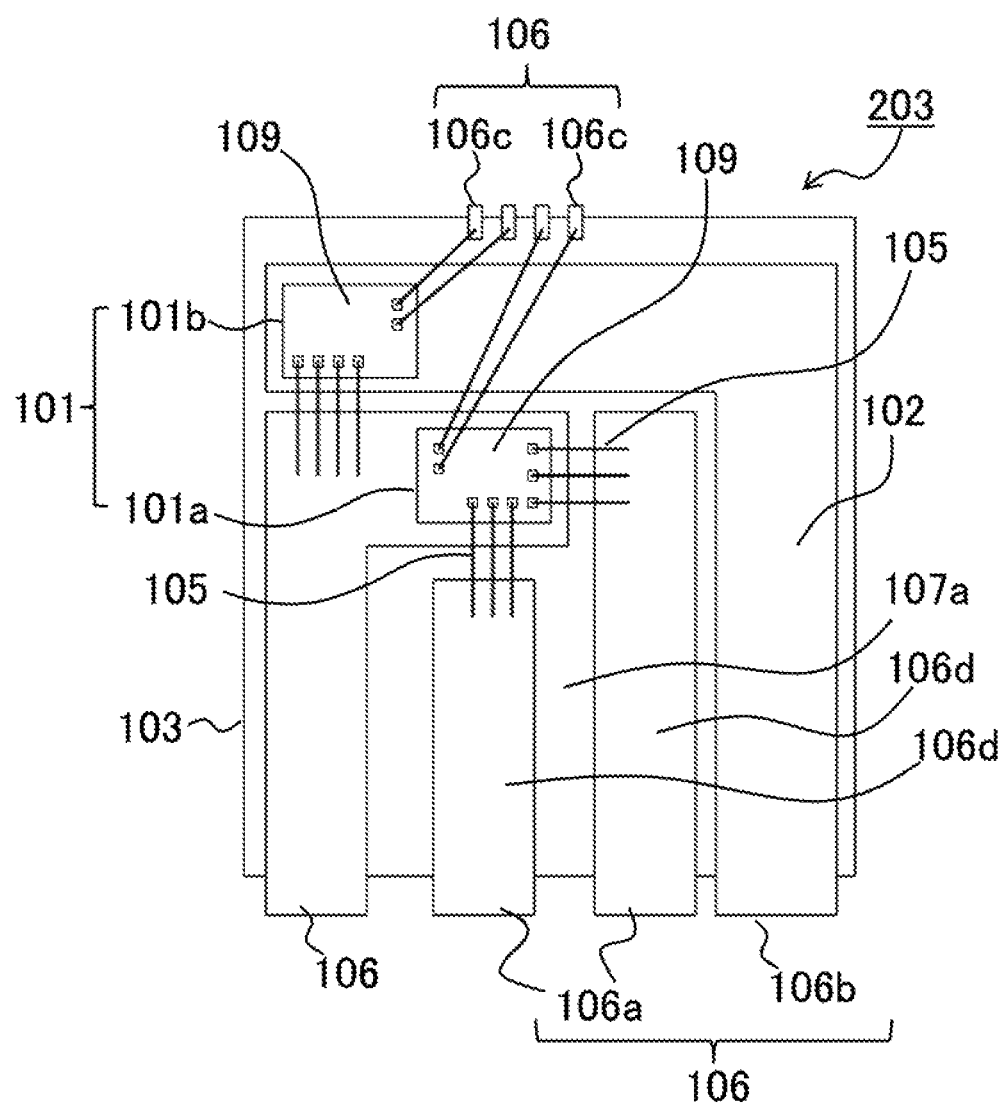
FIG. 2 is a plan view showing an internal configuration of the semiconductor module according to the first embodiment.

FIG. 1 is a circuit diagram showing a semiconductor module according to the first embodiment. Also, FIG. 2 is a planar layout drawing showing an internal configuration of the semiconductor module according to the first embodiment. In FIGS. 1 and 2, a semiconductor module 203 is such that a set of electronic parts configuring a circuit, that is, a MOSFET 101, is mounted on a lead frame 102 protected by a resin mold 103.

The MOSFET 101, furthermore, is connected to the lead frame 102 via connection means, a bonding wire 105 for example, acting as a connection line. The lead frame 102 is drawn out from the resin mold 103 as an external connection terminal 106, and as a whole, one arm's worth of upper and lower arms of an inverter is gathered together in one package. In FIGS. 1 and 2, the MOSFET 101 disposed on an upper side in the drawing indicates an upper side MOSFET 101b, and the MOSFET 101 disposed on a lower side indicates a lower side MOSFET 101a. The first embodiment will be described centered on the lower side MOSFET 101a.

The semiconductor module 203 is for mounting in a vehicle, or the like, and needs to be mounted in a limited space, because of which the semiconductor module 203 is required to be of a small size. Also, a reduction in wiring pattern inductance is required in order to reduce a surge voltage generated when the MOSFET 101, which is a semiconductor element, switches.

As shown in FIG. 2, a multiple of external connection terminals 106 or wires are formed by the lead frame 102. The lower side MOSFET 101a, which is a semiconductor element, is mounted on a mounting portion of the external connection terminal 106, which is a first terminal.

The semiconductor module 203 according to the first embodiment is such that the external connection terminal 106 having a multiple of wiring portions 106d is disposed in a periphery of the lower side MOSFET 101a. A lower side MOSFET source potential terminal 106a, which is the external connection terminal 106 having the multiple of wiring portions 106d, is a second terminal. The bonding wire 105, which is a connection line, extends in multiple directions from a source face 109 formed on an upper face of the lower side MOSFET 101a. Further, the bonding wire 105 extending in multiple directions is connected to each of the multiple of wiring portions 106d of the external connection terminal 106. Because of this, parallelization of energization paths can be realized, forming a wiring structure for reducing surge voltage. The multiple of bonding wires 105 are extended from differing side end faces of the lower side MOSFET 101a. In FIG. 2, the external connection terminal 106 having the multiple of wiring portions 106d is an upper face potential terminal of the lower side MOSFET 101a in a lower arm of upper and lower arms, and specifically, is the lower side MOSFET source potential terminal 106a, as previously described. In the semiconductor module 203, the bonding wires 105, which are a multiple of connection lines, and the multiple of wiring portions 106d, which form current paths with the multiple of connection lines, are of the same potential.

The semiconductor module 203 according to the first embodiment is such that a free region 107a is provided inside the semiconductor module 203. The free region 107a is provided among the multiple of wiring portions 106d. Also, the free region 107a is provided on a large current terminal side of the lower side MOSFET 101a in the semiconductor module 203.

In FIG. 2, the semiconductor module 203 is formed by the MOSFET 101, which is a semiconductor element, the bonding wires 105, which are a multiple of connection lines, and the multiple of external connection terminals 106, which are the first terminal, the second terminal and the like, formed of the lead frame 102 being sealed with the resin mold 103.

The external connection terminal 106 is formed protruding to an exterior from an end face of the resin mold 103. In FIG. 2, the external connection terminal 106 disposed in one end face of the resin mold 103 is a small signal terminal 106c that carries a current of in the region of, for example, several milliamps or less. The small signal terminal 106c is a third terminal, and is provided on an upper side of the drawing in FIG. 2.

Also, the external connection terminal 106 disposed in another end face opposing the one end face of the resin mold 103 is a large current terminal that carries a current of in the region of, for example, several hundred amps. The large current terminal is the first terminal and the second terminal, and is provided on a lower side of the drawing in FIG. 2. In the semiconductor module 203 according to the first embodiment, the free region 107a is provided on the lower side MOSFET source potential terminal 106a side.

In FIG. 2, the small signal terminal 106c and the external connection terminal 106 that is a large current terminal are disposed on opposing sides, but the small signal terminal 106c and the external connection terminal 106 need not necessarily be caused to oppose. The small signal terminal 106c may, for example, be provided on two side faces of the resin mold 103 that intersect at the one end face. Also, it is not necessary that all of the small signal terminals 106c and all of the external connection terminals 106 that are large current terminals are set on the same side. It is sufficient that the first terminal and the second terminal, which are large current terminals, are formed protruding to the exterior from an end face of the resin mold 103 other than the one end face of the resin mold 103 in which the third terminal is provided.

In the first embodiment, a description has been given centered on the lower side MOSFET 101a, but with respect to the upper side MOSFET 101b too, parallelization of energization paths can be realized using the same method, thereby achieving a reduction in wiring pattern inductance.

Setting an upper side MOSFET drain potential terminal 106b and the lower side MOSFET source potential terminal 106a on the same side of the semiconductor module 203 is useful for machinability and for connecting to an external part.

Also, when extending connection lines in the same direction from the same side or immediately adjacent sides of a semiconductor element, only a reduction in wiring inductance owing to a sectional area of the connection lines increasing can be expected, but by connection lines being extended in multiple directions from vicinities of different sides of a semiconductor element, a multiple of energization paths are formed, and the number of parallel wires increases, because of which a reduction in wiring inductance can be achieved.

Second Embodiment

Figure 3:
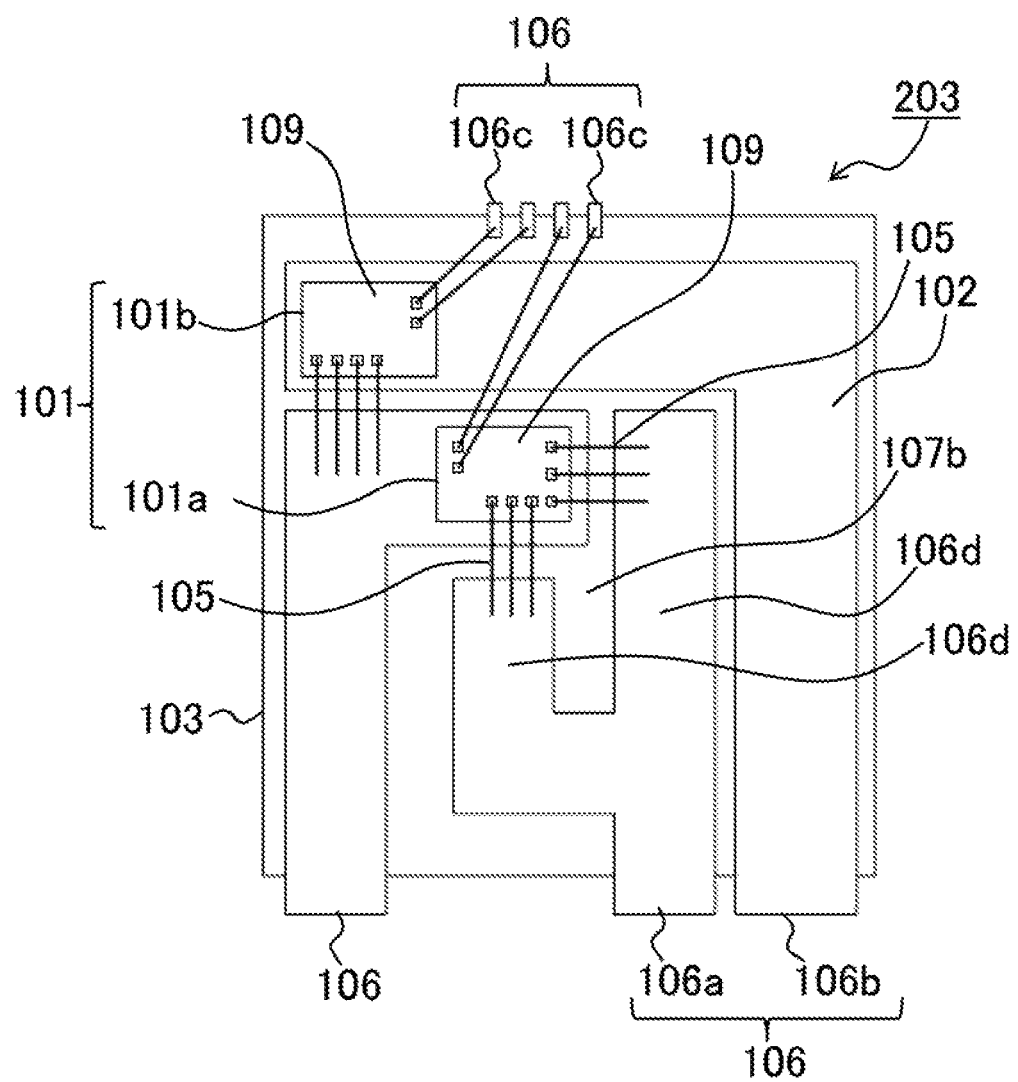
FIG. 3 is a plan view showing an internal configuration of a semiconductor module according to a second embodiment.

FIG. 3 is a planar layout drawing showing an internal configuration of a semiconductor module according to a second embodiment. In the second embodiment, the multiple of branched wiring portions 106d are connected before protruding to the exterior from the other end face of the resin mold 103 previously described in the first embodiment, as shown in FIG. 3. Also, a free region 107b is provided among the wiring portions 106d. The semiconductor module 203 according to the second embodiment is such that by the wiring portions 106d being connected before extending to the exterior of the resin mold 103 as the external connection terminal 106, a reduction in the number of manufacturing steps can be achieved owing to a reduction in the number of junctions with other parts on the exterior of the semiconductor module 203. Also, the semiconductor module 203 according to the second embodiment has an advantage in that a wiring length can be reduced with respect to a structure wherein the branched wiring portions 106d are connected in the exterior of the semiconductor module 203, because of which the wiring inductance can be further reduced.

Third Embodiment

Figure 4:
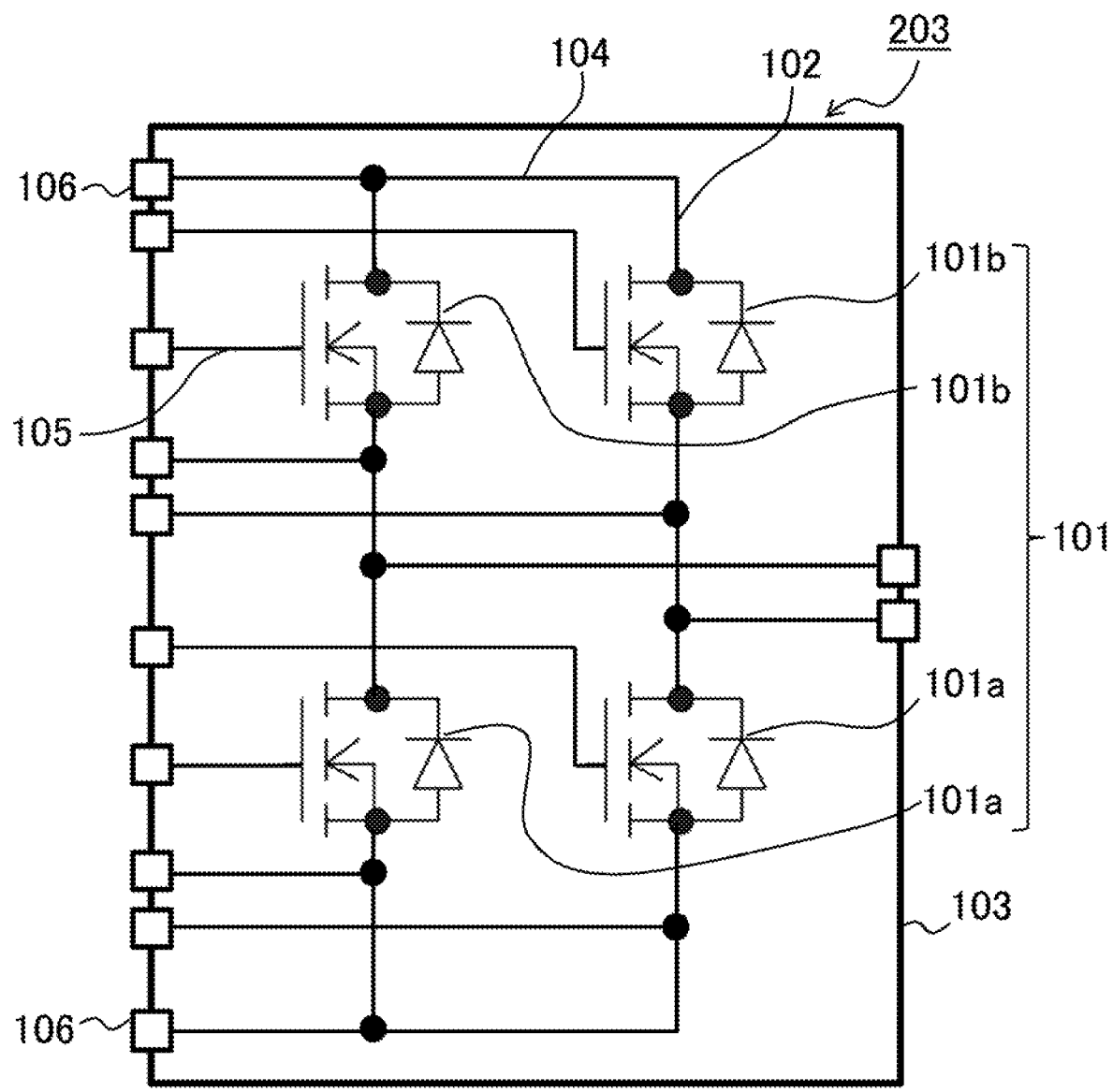
FIG. 4 is a circuit diagram showing a semiconductor module according to a third embodiment.

FIG. 4 is a circuit diagram showing a semiconductor module according to a third embodiment. In FIG. 4 too, in the same way as in FIG. 1, a set of electronic parts configuring a circuit, that is, the MOSFET 101, is mounted on the lead frame 102 protected by the resin mold 103.

Furthermore, each part is connected to the lead frame 102 via connection means, those being a clip lead 104 and the bonding wire 105. The lead frame 102 is drawn out to the external connection terminal 106 of the resin mold 103, and as a whole, a primary side circuit of a step-down converter is gathered together in one package.

Figure 5:
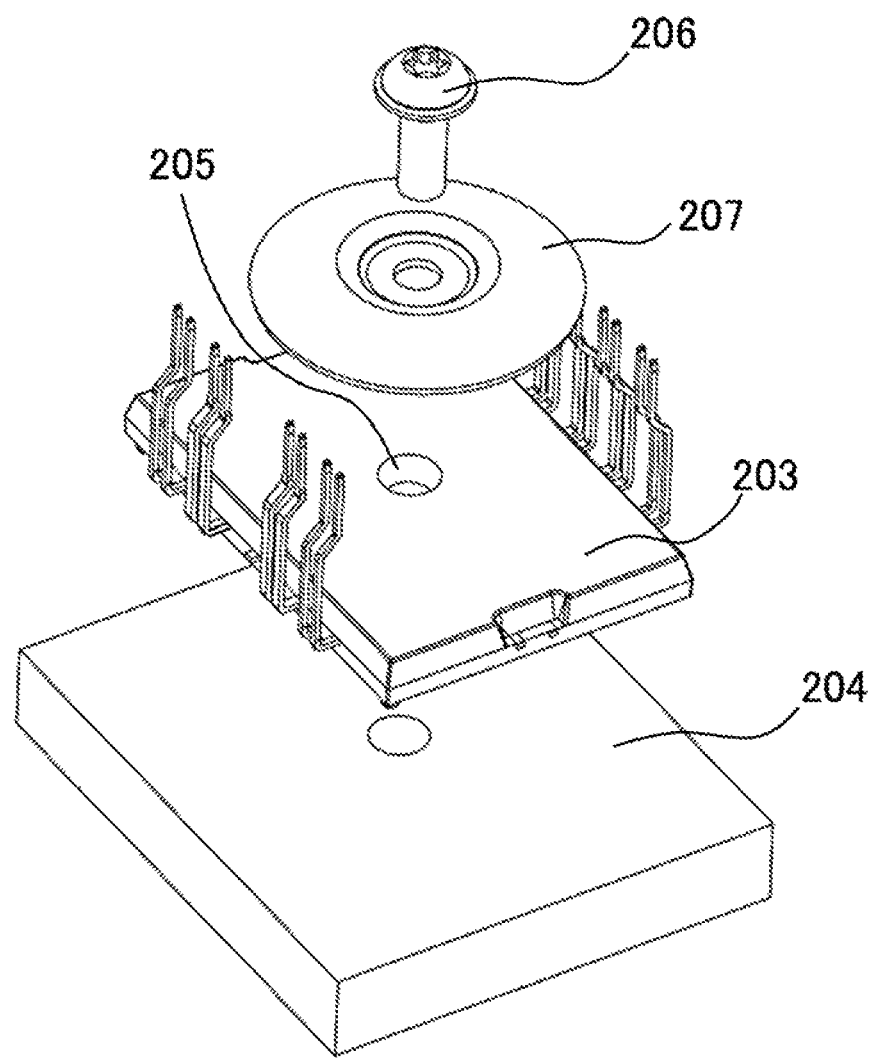
FIG. 5 is a perspective view showing an example wherein the semiconductor module according to the third embodiment is attached to a product.

FIG. 5 is a perspective view showing an example wherein the semiconductor module according to the third embodiment is attached to a product. As the MOSFET 101 generates heat due to current energization when converting power, dissipating heat by pressing down onto a heatsink 204 on a lower face of the semiconductor module 203 using a spring 207 or the like, as shown in FIG. 5, is useful. A hole portion 205 is provided in a central portion of a main body of the semiconductor module 203. The spring 207, in whose center a hole is opened, is installed above the semiconductor module 203, and the spring 207 and the semiconductor module 203 are simultaneously fastened from above using a screw 206. Because of this, a reduction in area of the semiconductor module 203, including the spring 207, and a stable pressing down of the semiconductor module 203 by the spring 207, can be achieved.

Figure 6:
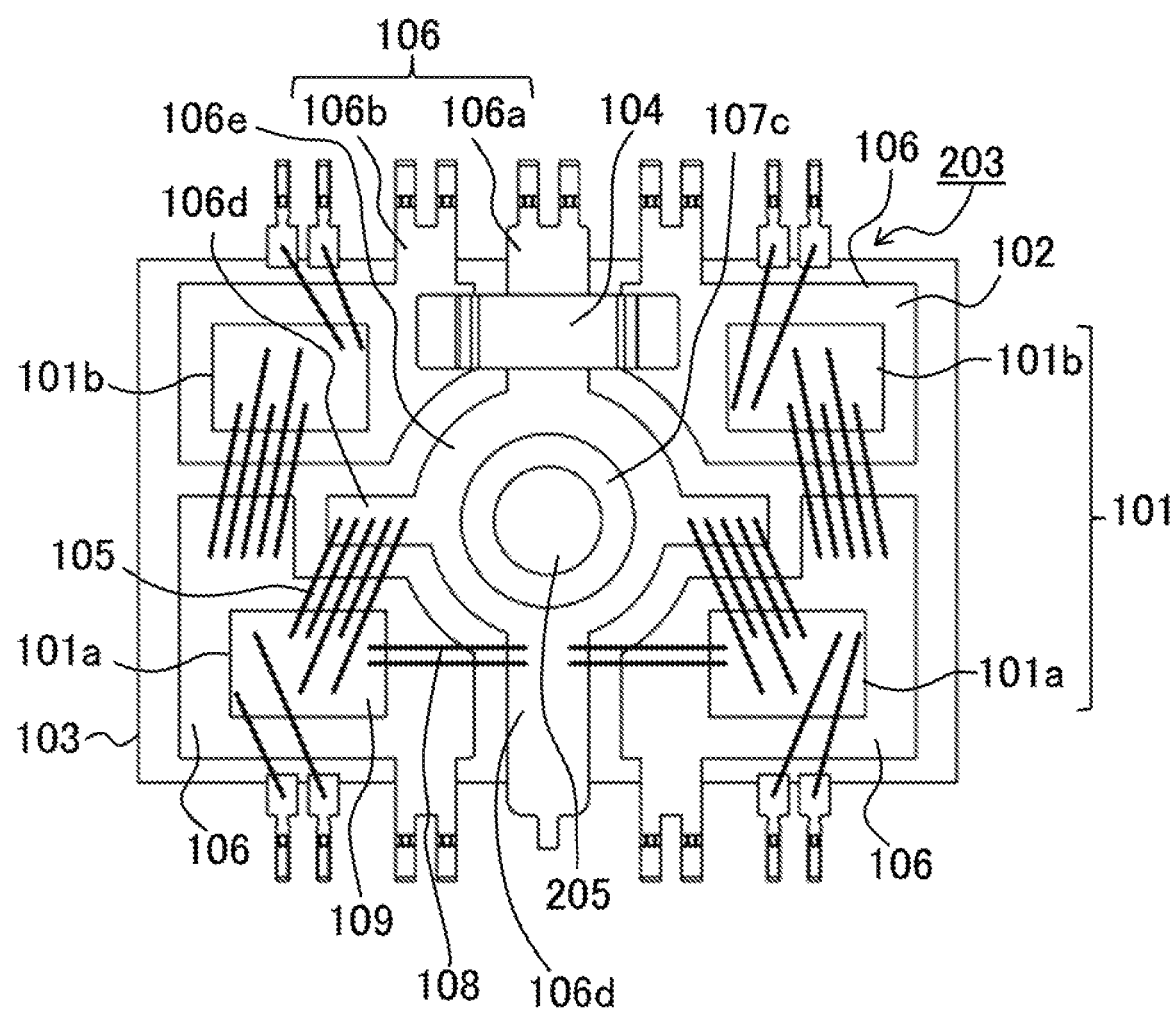
FIG. 6 is a plan view showing an internal configuration of the semiconductor module according to the third embodiment.

FIG. 6 is a plan view showing an internal configuration of the semiconductor module according to the third embodiment. FIG. 6 shows a wiring structure for reducing surge voltage in the semiconductor module 203, in whose center the hole portion 205 is provided. In the third embodiment, mounting positions of the MOSFET 101 and the lead frame 102 on which the MOSFET 101 is mounted are arranged with linear symmetry centered on the lead frame 102 of the lower side MOSFET source potential terminal 106a disposed in the center of the semiconductor module 203. Because of this, the semiconductor module 203 according to the third embodiment is such that stray capacitance imbalance is reduced.

In the third embodiment too, in the same way as in the first and second embodiments, parallelization of energization paths can be realized by wiring from the source face 109, which is the upper face of the lower side MOSFET 101a, being extended in multiple directions, and wiring inductance can be reduced.

Also, multi-parallelization of energization paths can be realized by the lead frame 102 forming the lower side MOSFET source potential terminal 106a being annular, whereby wiring inductance can be further reduced.

In the third embodiment too, in the same way as in the first and second embodiments, the lower side MOSFET 101a, which is a semiconductor element, is mounted on a mounting portion of the external connection terminal 106, which is the first terminal. The lower side MOSFET source potential terminal 106a, which is the second terminal, has an annular portion 106e formed integrally with the multiple of wiring portions 106d, and a free region 107c is provided among the multiple of wiring portions 106d. Specifically, the free region 107c is provided on an inner side of the annular portion 106e. As it is sufficient that the lower side MOSFET source potential terminal 106a has the annular portion 106e configured to be connected to the multiple of wiring portions 106d, the annular portion 106e and the multiple of wiring portions 106d may be formed integrally, or the annular portion 106e may be formed to be divided and connected to each of the multiple of wiring portions 106d.

The bonding wire 105 and a bonding wire 108, which are a multiple of connection lines, and the multiple of wiring portions 106d and the annular portion 106e forming current paths with each of the bonding wire 105 and the bonding wire 108, are of the same potential. That is, the annular lead frame 102 disposed in the center of the semiconductor module 203 is the lower side MOSFET source potential terminal 106a. Also, the hole portion 205 is formed in one portion of the free region 107c.

As shown in FIG. 6, the semiconductor module 203 is such that an H-bridge circuit is configured by a multiple of MOSFETs 101 including the lower side MOSFET 101a. The lower side MOSFET source potential terminal 106a, which is the second terminal, is formed of the lead frame 102. The free region 107c is disposed in a center of the lead frame 102, and the multiple of MOSFETs 101 are disposed with linear symmetry centered on the free region 107c.

Figure 7:
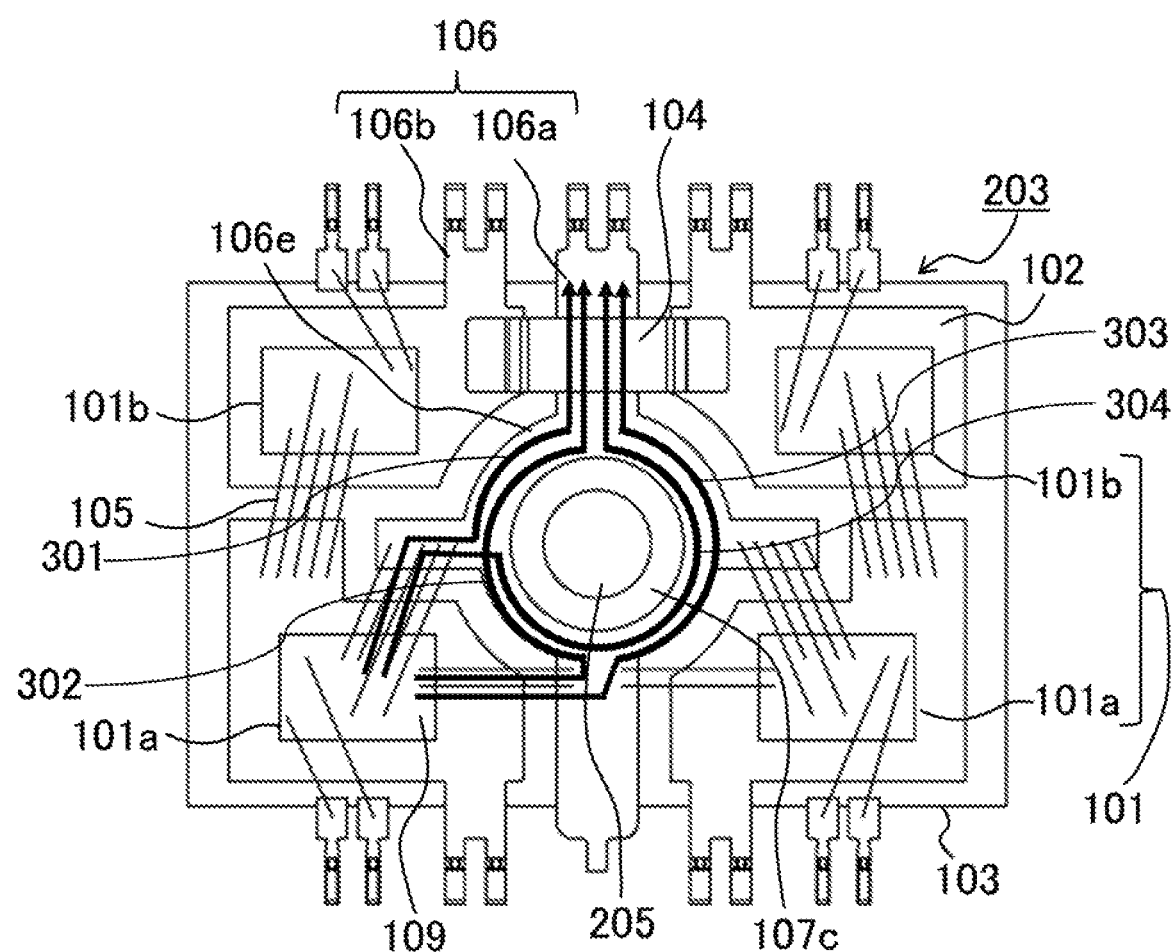
FIG. 7 is a plan view showing one example of current energization paths of the semiconductor module according to the third embodiment.

FIG. 7 is a plan view showing one example of current energization paths of the semiconductor module according to the third embodiment. FIG. 7 shows one example of current energization paths when the MOSFETs 101 are in an on-state and an off-state. In FIG. 7, there are a total of four current paths from the source face 109 of the lower side MOSFET 101a shown in the bottom left of the drawing, those being a current path 301, a current path 302, a current path 303, and a current path 304. The semiconductor module 203 has the four current paths in the annular portion 106e in a periphery of the free region 107c. The semiconductor module 203 according to the third embodiment is such that the annular lead frame 102 is disposed in a position nearer than the MOSFET 101 to the center of the semiconductor module 203, in order to reduce inductance and in order to achieve a short current path.

Figure 8:
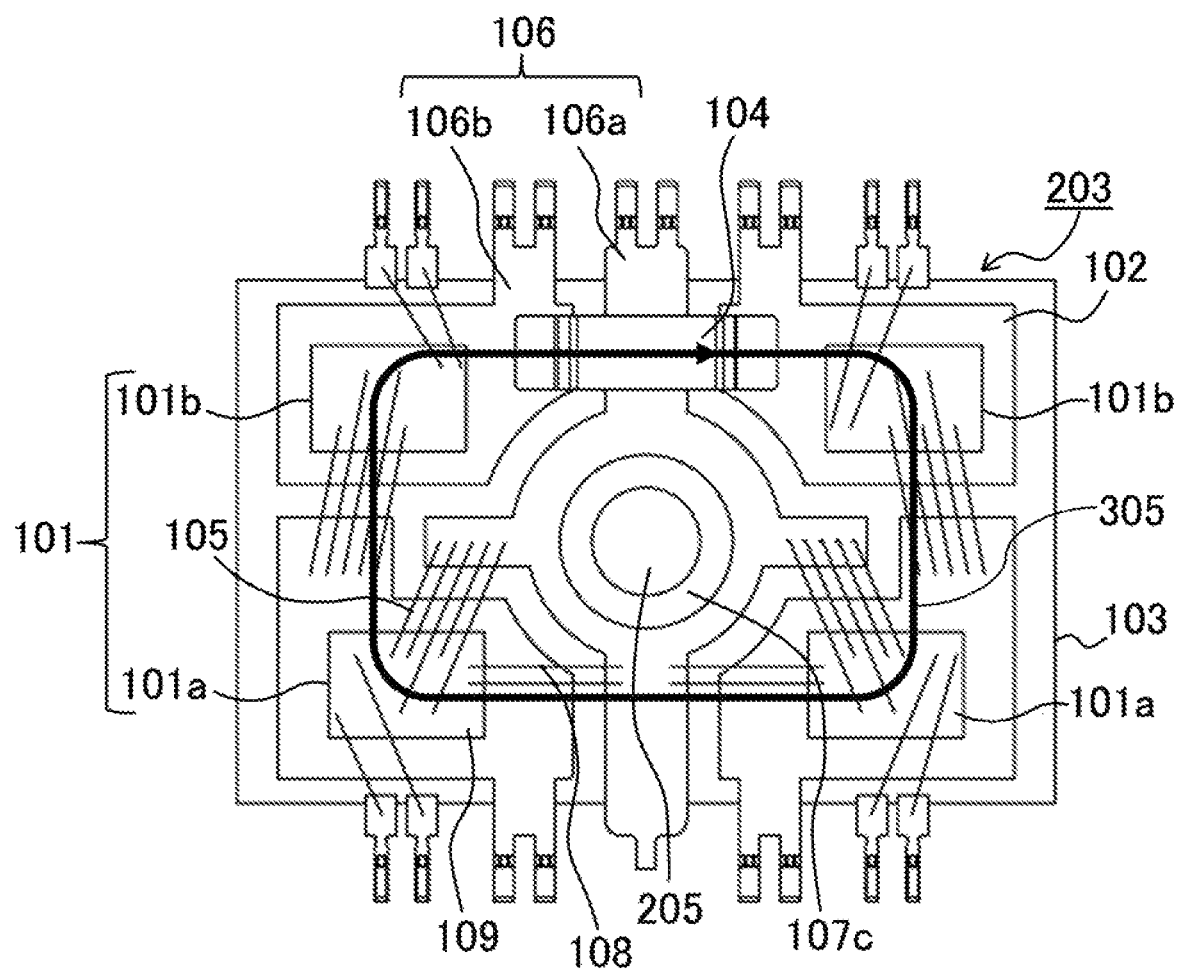
FIG. 8 is a plan view showing one example of a current energization path of the semiconductor module according to the third embodiment.

Also, FIG. 8 is a plan view showing one example of a current energization path of the semiconductor module according to the third embodiment. FIG. 8 shows one example of a current energization path when the MOSFETs 101 are all in an on-state. The semiconductor module 203 according to the third embodiment is such that wiring inductance of a current path 305 can be reduced by providing the bonding wire 108 extending in a horizontal direction of the lower side MOSFET 101a and the clip lead 104, which connects the lead frame 102 of the upper side MOSFET drain potential terminal 106b, as shown in FIG. 8.

In this case too, wiring inductance can be reduced by the connection lines (the bonding wire 105 and the bonding wire 108) from the lower side MOSFET 101a being extended in multiple directions and by an annular form being adopted for the lead frame 102 forming the lower side MOSFET source potential terminal 106a.

Also, as the annular lead frame 102 and the lead frame 102 on which the MOSFET 101 is mounted are each parallel plates, there is an advantage in that wiring inductance is reduced.

As the clip lead 104 connecting the lead frame 102 forming the upper side MOSFET drain potential terminal 106b and the annular lead frame 102 are also parallel plates, there is an advantage in that wiring inductance is reduced.

There is also an advantage when there are a multiple of the free regions 107c disposed in the center of the semiconductor module 203. However, for the sake of space conservation and the like, adopting a configuration wherein the free region 107c disposed in the center of the semiconductor module 203 is provided in one place, as shown in FIG. 6, is better.

Not being limited to being circular or elliptical, the annular lead frame 102 may be polygonal. There is an advantage whichever of the bonding wire 108 and the clip lead 104 is selected. A ribbon may also be adopted.

Fourth Embodiment

In a fourth embodiment, the semiconductor module according to the first to third embodiments is applied to a power conversion device. Although the present application is not limited to a specific power conversion device, a case wherein the present application is applied to a three-phase inverter will be described hereafter as the fourth embodiment.

Figure 9:
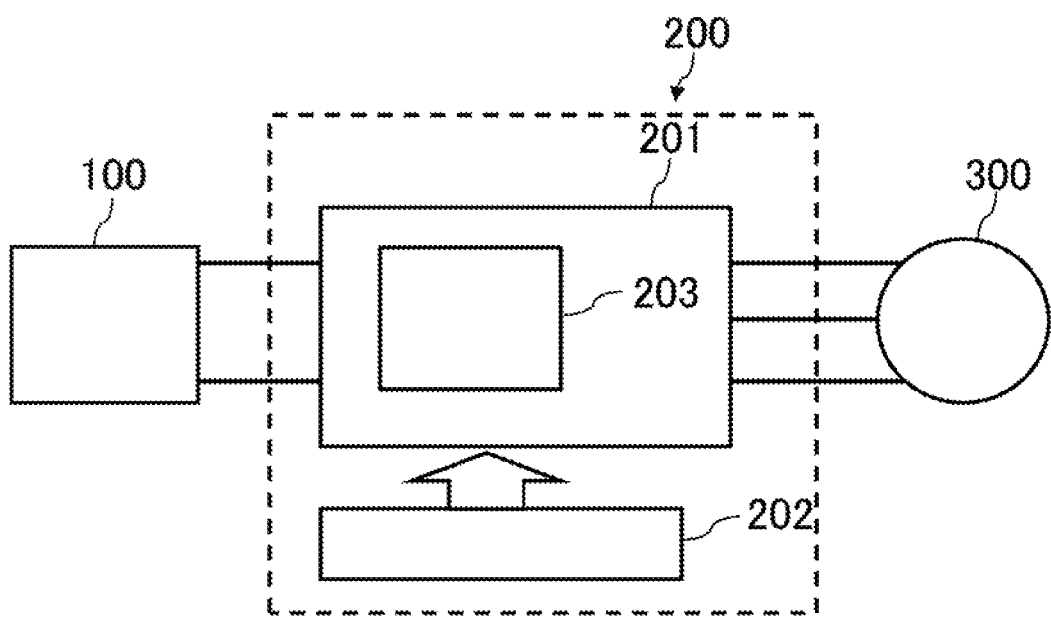
FIG. 9 is a block diagram showing a configuration of a power conversion system to which a power conversion device according to a fourth embodiment is applied.

FIG. 9 is a block diagram showing a configuration of a power conversion system to which a power conversion device according to the fourth embodiment is applied.

The power conversion system shown in FIG. 9 is configured of a power supply 100, a power conversion device 200, and a load 300. The power supply 100 is a direct current power supply, and supplies direct current power to the power conversion device 200. The power supply 100 can be configured of various components. For example, the power supply 100 can be configured of a direct current system, a photovoltaic cell, or a storage battery, or may be configured of a rectifying circuit and an AC/DC converter connected to an alternating current system. Also, the power supply 100 may be configured of a DC/DC converter that converts direct current power output from a direct current system into a predetermined power.

The power conversion device 200 is a three-phase inverter connected between the power supply 100 and the load 300, converts direct current power supplied from the power supply 100 into alternating current power, and supplies the alternating current power to the load 300. As shown in FIG. 9, the power conversion device 200 includes a main conversion circuit 201, which converts direct current power into alternating current power and outputs the alternating current power, and a control circuit 202, which outputs a control signal that controls the main conversion circuit 201 to the main conversion circuit 201.

The load 300 is a three-phase motor driven by alternating current power supplied from the power conversion device 200. The load 300, not being limited to a specific application, is a motor mounted in various kinds of electrical equipment. For example, the load 300 is used as a motor fox a hybrid vehicle or an electric vehicle, a railroad vehicle, an elevator, or an air conditioner.

Hereafter, details of the power conversion device 200 will be described. The main conversion circuit 201 includes a switching element and a freewheeling diode (not shown), and by the switching element switching, direct current power supplied from the power supply 100 is converted into alternating current power, and supplied to the load 300. Although there are various specific circuit configurations of the main conversion circuit 201, the main conversion circuit 201 according to the fourth embodiment is a two-level, three-phase full bridge circuit, and can be configured of six switching elements, and six freewheeling diodes connected one each in anti-parallel to the switching elements. Each switching element and each freewheeling diode of the main conversion circuit 201 is configured using the semiconductor module 203 corresponding to any one of the first to third embodiments. The six switching elements are connected in series in pairs to configure an upper and lower arm, and each upper and lower arm configures each phase (a U-phase, a V-phase, and a W-phase) of the full bridge circuit. Further, an output terminal of each upper and lower arm, that is, three output terminals of the main conversion circuit 201, are connected to the load 300.

Also, the main conversion circuit 201 includes a drive circuit (not shown) that drives each switching element, but the drive circuit may be incorporated in the semiconductor module 203, or a configuration that includes a drive circuit separately from the semiconductor module 203 may be adopted. The drive circuit generates a drive signal that drives the switching element of the main conversion circuit 201, and supplies the drive signal to a control electrode of the switching element of the main conversion circuit 201. Specifically, the drive circuit outputs a drive signal that drives the switching element into an on-state or a drive signal that drives the switching element into an off-state to the control electrode of each switching element in accordance with a control signal from the control circuit 202, to be described hereafter. When the switching element is maintained in an on-state, the drive signal is a voltage signal (an on-state signal) equal to or greater than a threshold voltage of the switching element, and when the switching element is maintained in an off-state, the drive signal is a voltage signal (an off-state signal) equal to or less than the threshold voltage of the switching element.

The control circuit 202 controls the switching elements of the main conversion circuit 201 so that a desired power is supplied to the load 300. Specifically, the control circuit 200 calculates a time (an on-state time) for which each switching element of the main conversion circuit 201 is to be in an on-state, based on power to be supplied to the load 300. For example, the control circuit 202 can control the main conversion circuit 201 using PWM control that modulates the on-state time of the switching element in accordance with a voltage to be output. Further, the control circuit 202 outputs a control command (a control signal) to the drive circuit included in the main conversion circuit 201 so that an on-state signal is output to a switching element that is to be in an on-state at each point, and an off-state signal is output to a switching element that is to be in an off-state. The drive circuit outputs an on-state signal or an off-state signal as a drive signal to the control electrode of each switching element in accordance with the control signal.

The power conversion device according to the fourth embodiment is such that the semiconductor module 203 according to the first to third embodiments is applied as the switching element and the freewheeling diode of the main conversion circuit 201, because of which an increase in reliability can be realized.

An example wherein the present application is applied to a two-level, three-phase inverter has been described in the fourth embodiment, but not being limited to this, the present application can be applied to various power conversion devices. Although a two-level power conversion device is adopted in the fourth embodiment, a three-level or a multi-level power conversion device may be adopted, and when power is supplied to a single-phase load, the present application may be applied to a single-phase inverter. Also, the present application can be applied to a DC/DC converter or an AC/DC converter when power is supplied to a direct current load or the like.

Also, not being limited to the heretofore described case wherein the load is a motor, the power conversion device to which the present application is applied can be used as, for example, a power supply device of an electric discharge machine, a laser processing machine, an induction heating cooker, or a contactless power supply system, and furthermore, the power conversion device can be used as a power conditioner of a photovoltaic power generation system, a power storage system, or the like.

Although the present application is described above in terms of various exemplifying embodiments and implementations, it should be understood that the various features, aspects, and functions described in one or more of the individual embodiments are not limited in their applicability to the particular embodiment with which they are described, but instead can be applied, alone or in various combinations, to one or more of the embodiments.

It is therefore understood that numerous modifications that have not been exemplified can be devised without departing from the scope of the present application. For example, at least one constituent component may be modified, added, or omitted, and furthermore, at least one of the constituent components may be selected and combined with the constituent components mentioned in another preferred embodiment.

What is claimed is:

1. A semiconductor module, comprising:
   a semiconductor element;
   a first terminal on which the semiconductor element is mounted;
   a second terminal disposed in a periphery of the semiconductor element and having a multiple of wiring portions; and
   a multiple of connection lines extending in multiple directions from an upper face of the semiconductor element and connected to each of the multiple of wiring portions of the second terminal, wherein
   a free region is provided among the multiple of wiring portions, and
   the multiple of connection lines and the multiple of wiring portions forming current paths with each of the multiple of connection lines at a same potential.

2. The semiconductor module according to claim 1, wherein the multiple of connection lines are extended from different side end faces of the semiconductor element.

3. The semiconductor module according to claim 1, comprising:
   a resin mold that seals the semiconductor element, the first terminal, the second terminal, and the multiple of connection lines; and
   a third terminal formed protruding to an exterior from one end face of the resin mold, wherein
   the first terminal or the second terminal is formed protruding to the exterior from an end face of the resin mold other than the one end face of the resin mold,
   a first current energizing the first terminal or the second terminal is greater than a second current energizing the third terminal, and
   the free region is provided on the other end face side of the semiconductor element.

4. The semiconductor module according to claim 3, wherein the multiple of wiring portions are connected before protruding to the exterior from the other end face of the resin mold.

5. The semiconductor module according to claim 1, wherein the second terminal is a potential terminal of the upper face of the semiconductor element of a lower arm of upper and lower arms configured by a multiple of semiconductor elements including the semiconductor element being connected.

6. The semiconductor module according to claim 1, wherein the second terminal has an annular portion connected to, or integrally formed with, the multiple of wiring portions,
   the free region is provided on an inner side of the annular portion, and
   the multiple of connection lines and the multiple of wiring portions and the annular portion forming current paths with each of the multiple of connection lines are of the same potential.

7. The semiconductor module according to claim 6, wherein a hole portion is formed in one portion of the free region.

8. The semiconductor module according to claim 6, wherein an H-bridge circuit is configured by a multiple of semiconductor elements including the semiconductor element,
   the second terminal is formed of a lead frame, the free region is disposed in a center of the lead frame, and
   the multiple of semiconductor elements are disposed with linear symmetry centered on the free region.

9. The semiconductor module according to claim 8, comprising four current paths in the annular portion in a periphery of the free region.

10. The semiconductor module according to claim 7, wherein an H-bridge circuit is configured by a multiple of semiconductor elements including the semiconductor element,
    the second terminal is formed of a lead frame, the free region is disposed in a center of the lead frame, and
    the multiple of semiconductor elements are disposed with linear symmetry centered on the free region.

11. The semiconductor module according to claim 10, comprising four current paths in the annular portion in a periphery of the free region.

12. The semiconductor module according to claim 2, comprising:
    a resin mold that seals the semiconductor element, the first terminal, the second terminal, and the multiple of connection lines; and
    a third terminal formed protruding to an exterior from one end face of the resin mold, wherein
    the first terminal or the second terminal is formed protruding to the exterior from an end face of the resin mold other than the one end face of the resin mold,
    a first current energizing the first terminal or the second terminal is greater than a second current energizing the third terminal, and
    the free region is provided on the other end face side of the semiconductor element.

13. The semiconductor module according to claim 12, wherein the multiple of wiring portions are connected before protruding to the exterior from the other end face of the resin mold.

14. The semiconductor module according to claim 2, wherein the second terminal is a potential terminal of the upper face of the semiconductor element of a lower arm of upper and lower arms configured by a multiple of semiconductor elements including the semiconductor element being connected.

15. The semiconductor module according to claim 2, wherein the second terminal has an annular portion connected to, or integrally formed with, the multiple of wiring portions,
   the free region is provided on an inner side of the annular portion, and
   the multiple of connection lines and the multiple of wiring portions and the annular portion forming current paths with each of the multiple of connection lines are of the same potential.

16. The semiconductor module according to claim 15, wherein a hole portion is formed in one portion of the free region.

17. The semiconductor module according to claim 15, wherein an H-bridge circuit is configured by a multiple of semiconductor elements including the semiconductor element,
   the second terminal is formed of a lead frame, the free region is disposed in a center of the lead frame, and
   the multiple of semiconductor elements are disposed with linear symmetry centered on the free region.

18. The semiconductor module according to claim 3, wherein the second terminal is a potential terminal of the upper face of the semiconductor element of a lower arm of upper and lower arms configured by a multiple of semiconductor elements including the semiconductor element being connected.

19. The semiconductor module according to claim 4, wherein the second terminal is a potential terminal of the upper face of the semiconductor element of a lower arm of upper and lower arms configured by a multiple of semiconductor elements including the semiconductor element being connected.

20. A power conversion device, comprising:
   the semiconductor module according to claim 1;
   a main conversion circuit that converts and outputs an input power; and
   a control circuit that outputs a control signal that controls the main conversion circuit to the main conversion circuit.

21. The semiconductor module of claim 3, wherein the first current flows through a source or a drain of the semiconductor element, and the second current flows through a gate of the semiconductor element.

\* \* \* \* \*